United States Patent [19]
Tobita

[11] Patent Number: 5,267,200
[45] Date of Patent: Nov. 30, 1993

[54] SEMICONDUCTOR MEMORY DEVICE AND OPERATING METHOD THEREOF WITH TRANSFER TRANSISTOR USED AS A HOLDING MEANS

[75] Inventor: Youichi Tobita, Hyogo, Japan

[73] Assignee: Mitsubishi Denki Kabushiki Kaisha, Tokyo, Japan

[21] Appl. No.: 399,946

[22] Filed: Aug. 31, 1989

[30] Foreign Application Priority Data

Aug. 31, 1988 [JP] Japan .................................. 63-218715
Jul. 14, 1989 [JP] Japan .................................. 1-183217

[51] Int. Cl.$^5$ .............................................. G11C 11/00
[52] U.S. Cl. .......................... 365/189.05; 365/230.08; 365/236; 365/239; 365/840
[58] Field of Search .................... 365/230.08, 189.05, 365/239, 240, 236

[56] References Cited

U.S. PATENT DOCUMENTS

| | | |
|---|---|---|
| 4,344,156 | 8/1982 | Eaton, Jr. et al. . |
| 4,715,017 | 12/1987 | Iwahashi .................. 365/230.08 |
| 4,758,995 | 7/1988 | Sago . |
| 4,789,960 | 12/1988 | Willis ....................... 365/189.05 |
| 4,811,294 | 3/1989 | Kobayashi et al. ........ 365/189.05 |
| 4,849,937 | 7/1989 | Yoshimoto ................ 365/189.05 |
| 4,897,816 | 1/1990 | Kogan ...................... 365/230.08 |
| 4,903,242 | 1/1990 | Hamaguchi et al. ....... 365/230.08 |

FOREIGN PATENT DOCUMENTS 61-18837 5/1986 Japan .

Primary Examiner—Joseph E. Clawson, Jr.
Attorney, Agent, or Firm—Lowe, Price, LeBlanc & Becker

[57] ABSTRACT

A semiconductor memory device comprises a memory cell array (1) comprising a plurality of memory cells (MC) arranged in a matrix. A Y decoder (5) is responsive to an external address signal for outputting a selecting signal which simultaneously selects a plurality of columns in the memory cell array (1). The selecting signal is held by a latch transistor (LT). A selector (9b) sequentially applies input data to a plurality of columns simultaneously selected by the selecting signal held by the latch transistor (LT). During operation of the selector (9b), a binary counter (11) generates the subsequent internal column address signal, to which the Y decoder (5) is responsive for generating a selecting signal which simultaneously selects another plurality of columns in the memory cell array (1). As a result, the selecting operation in response to the subsequent selecting signal is performed immediately after operation of the selector (9b) is accomplished.

18 Claims, 11 Drawing Sheets

SEMICONDUCTOR MEMORY DEVICE AND OPERATING METHOD THEREOF WITH TRANSFER TRANSISTOR USED AS A HOLDING MEANS

BACKGROUND OF THE INVENTION

1. Field of the Invention

The present invention relates to semiconductor memory devices and operating methods thereof, and more particularly, to a semiconductor memory device capable of operating at a high speed and an operating method thereof.

2. Description of the Background Art

A general dynamic random access memory (referred to as DRAM hereinafter) includes a memory cell array comprising a plurality of memory cells arranged in rows and columns. In writing or reading data., one row of the memory cell array is selected in response to a row address signal which is applied externally, and one column of the memory cell array is selected in response to a column address signal which is applied externally. Data is written in a memory cell located at the intersection of the selected row and column, or read out of the same.

In a DRAM which receives a duplexed address signal of a row address signal and a column address signal, an externally applied row address strobe signal $\overline{RAS}$ is activated so that the row address signal is accepted, and an externally applied column address strobe signal $\overline{CAS}$ is activated so that the column address signal is accepted.

In addition, a nibble mode is used to obtain a higher operating speed of the DRAM. In the nibble mode, writing or reading of data is performed in such a manner that after the row address strobe signal $\overline{RAS}$ and the column address strobe signal $\overline{CAS}$ are once activated (or put in the low level), only the column strobe signal $\overline{CAS}$ is put in an active state (low level) and in an inactive state (high level) by turns repeatedly. In other words, since in the nibble mode the writing or reading operation of data is performed regarding the time when the column address strobe signal $\overline{CAS}$ is put in the active state as a starting point, it is possible to attain a higher operating speed than a general reading operation regarding the time when the row address strobe signal $\overline{RAS}$ is put in the active state as a starting point.

A nibble mode of a conventional DRAM will be described with reference to timing charts in FIGS. 10 and 11. The nibble modes are disclosed, for example, in the Japanese Patent Publication No. 18837/1986 and the U.S. Pat. No. 4,344,156.

In FIGS. 10 and 11, the row address strobe signal $\overline{RAS}$ transits from the high level to the low level so that the operation of the DRAM is activated, and at the same time, the DRAM accepts only a row address signal out of a duplexed address signal. As a result, the corresponding row address $(X_n)$ of the memory cell array is selected. When the duplexed address signal changes to a column address signal, the corresponding column address $(Y_n)$ of the memory array is selected in response to the column address signal.

Assuming that writing operation is designated by a reading/writing designating signal at this moment, a memory cell located at the intersection $(X_n, Y_n)$ of the row and column addresses selected as described above is selected, and at the same time, the memory cells of addresses $(X_n, Y_{n+1})$, $(X_n, Y_{n+2})$ and $(X_n, Y_{n+3})$ on the same row are selected.

As shown in FIG. 10, when the column address strobe signal $\overline{CAS}$ transits in turn from the high level to the low level, an input data $D_{IN}$ is written in one of the four memory cells which corresponds to the address $(X_n, Y_n)$.

Additionally, while the row address strobe signal $\overline{RAS}$ is held in an active state (low level), the column address strobe signal $\overline{CAS}$ is once put in the inactive state (high level) and again in an active state so that the input data $D_{IN}$ is written in a memory cell corresponding to the address $(X_n, Y_{n+1})$ Similarly, while the row address signal $\overline{RAS}$ is held in the active state, the operation of putting the column address strobe signal $\overline{CAS}$ in the inactive state and the active state alternately is repeated, so that the data are sequentially written in the memory cells corresponding to the addresses $(X_n, Y_{n+2})$ and $(X_n, Y_{n+3})$.

Thus, the input data is written in during a cycle time $t_{NC}$ of the column address strobe $\overline{CAS}$ with respect to the second and further subsequent fallings of the column address strobe signals $\overline{CAS}$ so that a higher writing speed is obtained than in a case where the writing is performed during a cycle time $t_{WC}$ of the row address strobe signal $\overline{RAS}$. In the products which have been currently offered for practical use, the ratio between the time $t_{WC}$ and the time $t_{NC}$ is about 4 to 1 so that the writing speed of the second through fourth data is four times as fast as that of the first one.

Meanwhile, assuming that reading operation is designated by the reading/writing designating signal, data in the memory cell at the intersection $(X_n, Y_n)$ of the row address and column address selected as described above is accepted by one of four output latch circuits (not shown). At the same time, the data in the memory cells at the addresses $(X_n, Y_{n+1})$, $(X_n, Y_{n+2})$ and $(X_n, Y_{n+3})$ on the same row are accepted by the remaining respective three output latch circuits.

When the column address strobe signal $\overline{CAS}$ transits in turn from the high level to the low level, one of the four data accepted by the four output latch circuits which corresponds to the address $(X_n, Y_n)$ is read out at an output terminal as an output data $D_{OUT}$. This data is read out when the time of $t_{RAC}$ has passed from the transition of the row address strobe signal $\overline{RAS}$ and also when the time of $t_{CAC}$ has passed from the transition of the column address strobe signal $\overline{CAS}$.

Additionally, while the row address strobe signal $\overline{RAS}$ is held in the active state (low level), the column address strobe signal $\overline{CAS}$ is once put in an inactive state (high level) and again in an active state so that one of the data accepted by the output latch circuits which corresponds to the address $(X_n, Y_{n+1})$ is read out at an output terminal as the output data $D_{OUT}$. Similarly, while the row address signal $\overline{RAS}$ is held in the active state, the operation of putting the column address strobe signal $\overline{CAS}$ in the inactive state and the active state alternately is repeated so that the data corresponding to the addresses $(X_n, Y_{n+2})$ and $(X_n, Y_{n+3})$ are sequentially read out as the output data $D_{OUT}$.

Thus, the output data are read out from the output latch circuits with respect to the second and further subsequent fallings of the column address strobe signal $\overline{CAS}$, which results in the reduced reading time of $t_{CAC}$. In the products which have been currently offered for practical use, the ratio between the time $t_{RAC}$ and the time $t_{CAC}$ is about 4 to 1 so that the reading speed of the second through fourth data is four times as fast as that of the first one.

As described in the foregoing, in the conventional nibble mode of DRAM, only three bit data of the four bit data are written in or read out at a higher speed. In order to increase the number of data written in at a higher speed, it might be effective to increase the number of memory cells to be selected first simultaneously and also the number of data input/output line pairs connected thereto. Also, in order to increase the number of data read out at a higher speed, the number of the output latch circuits might be increased advantageously. However, the output latch circuits and the data input/output line pairs have a relatively large occupied area so that there arises a problem of increased size of the integrated circuit chip and thus the increased cost thereof.

SUMMARY OF THE INVENTION

An object of the present invention is to attain a higher writing speed of data in a semiconductor memory device without increasing the occupied area thereof.

Another object of the present invention is to attain a higher reading speed of data in a semiconductor memory device without increasing the occupied area thereof.

Another object of the present invention is to attain a higher operating speed in a semiconductor memory device which comprises a random accessible memory and a serially accessible memory without increasing the occupied area thereof.

A semiconductor memory device according to the present invention comprises a memory cell array, an internal address generator, a first selecting device, a holding device, a second selecting device and a timing controller.

The memory cell array comprises a plurality of memory cells arranged in rows and columns. The internal address generator is responsive to an externally applied address signal for generating an internal column address signal. The first selecting device is responsive to the internal column address signal generated from the internal address generator for generating a selecting signal which selects simultaneously a plurality of columns in the memory cell array.

The holding device holds the selecting signal generated by the first selecting device. The second selecting device sequentially selects the plurality of columns simultaneously selected by the selecting signal held by the holding device. The writing device applies information from the external to the columns selected by the second selecting device. The timing controller performs timing control in such a manner that during the selecting operation by the second selecting device the selecting operation by the first selecting device is performed in response to the subsequent internal column address signal.

In such a semiconductor memory device, while a plurality of columns which have been selected by a selecting signal held by the holding device are sequentially selected by the second selecting device, the subsequent internal column address signal generated by the internal address generator is applied to the first selecting device. Therefore, the selecting operation by the first selecting device is performed during operation of the second selecting device. As a result, no specific time is required for the selecting operation by the first selecting device so that a higher speed of the writing operation can be attained.

A semiconductor memory device according to another aspect of the present invention comprises a memory cell array, an internal address generator, a first selecting device, a holding device, a second selecting device and a timing controller.

The first selecting device is responsive to an internal column address signal generated by the internal address generator for simultaneously selecting a plurality of columns in the memory cell array. The holding device holds information read out of the plurality of memory cells selected by the first selecting device. The second selecting device sequentially selects the plurality of pieces of information held by the holding device. The timing controller performs timing control in such a manner that while the second selecting device is selecting information, the selecting operation by the first selecting device is performed in response to the subsequent internal column address signal.

In such a semiconductor memory device, while a plurality of pieces of information held by the holding device are sequentially selected by the second selecting device, the subsequent internal column address signal generated by the internal address generator is applied to the first selecting device. In other words, during operation by the second selecting device, a plurality of pieces of information to be subsequently read out of the memory cell array are selected by the first selecting device. As a result, no specific time is required for the selecting operation by the first selecting device so that a higher speed of the reading operation can be attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described in detail with reference to the accompanying drawings.

Figure 1:
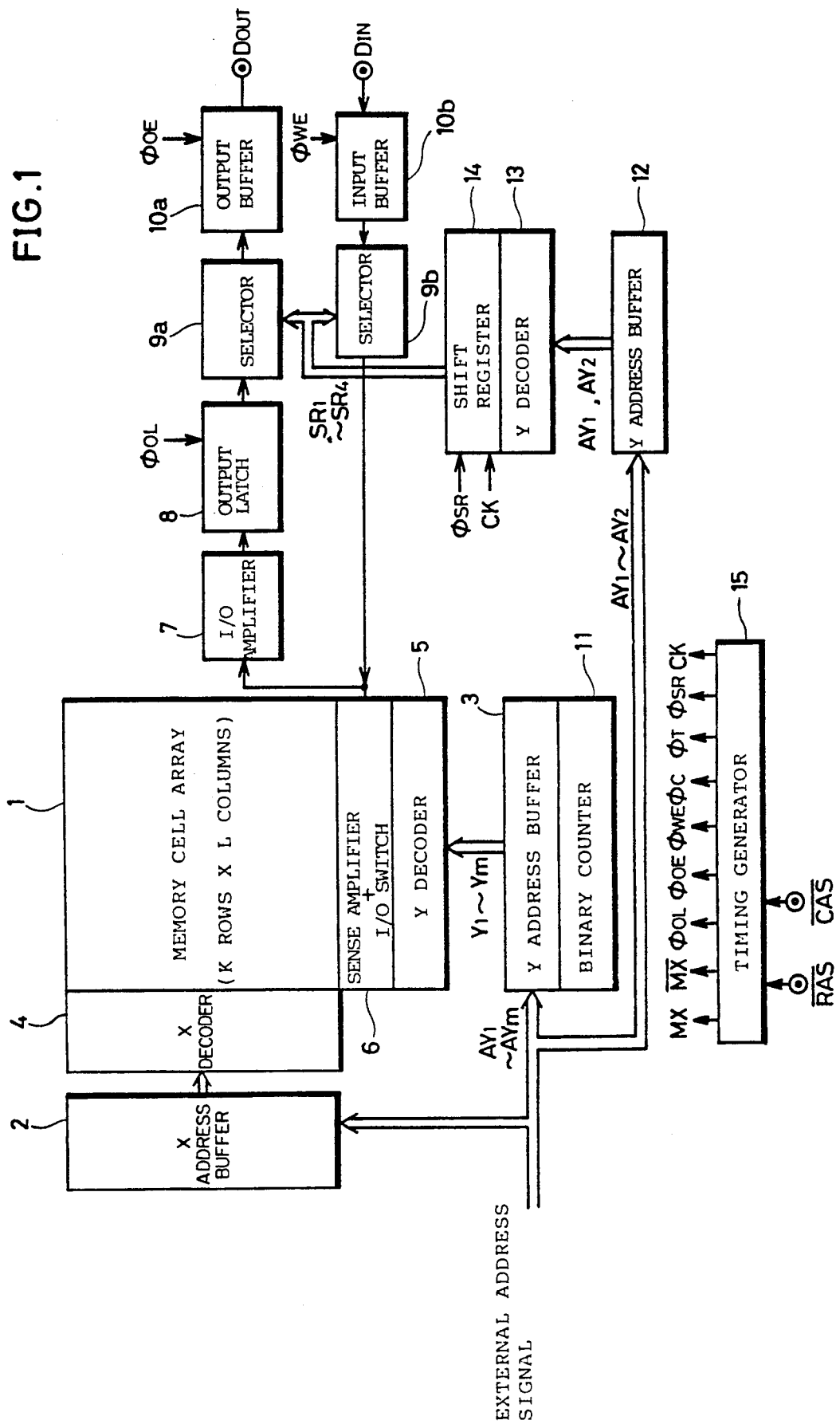
FIG. 1 is a block diagram showing a structure of a DRAM according to an embodiment of the present invention.

FIG. 1 is a block diagram schematically showing a structure of a DRAM according to an embodiment of the present invention.

In FIG. 1, a plurality of memory cells for storing data are arranged in K rows by L columns in a memory cell array 1. Each memory cell stores data (information). An X address buffer 2 receives an externally applied external address signal to generate an internal row address signal at a predetermined timing. A Y address buffer 3 receives an externally applied external address signal to generate an internal column address signal at a predetermined timing. An X decoder 4 decodes the internal row address signal from the X address buffer 2 to select the corresponding row in the memory cell array 1. A Y decoder 5 decodes the internal column address signal from the Y address buffer 3 to select the four corresponding columns in the memory cell array 1.

A (sense amplifier + I/O switch) block 6 (referred to simply as block 6 hereinafter) senses and amplifies data read out of a plurality of memory cells on the row selected by the X decoder 4, and outputs four data corresponding to the four columns selected by the Y decoder 5. Additionally, the block 6 writes data in the selected columns. An I/O amplifier 7 comprises four amplifier circuits and amplifies four data read out of the block 6. An output latch 8 comprises four latch circuits and latches four data outputted from the I/O amplifier 7. A selector 9a selects one of the four data latched by the output latch 8. An output buffer 10a outputs the data selected by the selector 9a to the external as an output data $D_{OUT}$. An input buffer 10b applies an externally applied input data $D_{In}$ to a selector 9b. The selector 9b selects one of four data input/output line pairs and applies the data from the input buffer 10b to the selected data input/output line pair.

Furthermore, a binary counter 11 is responsive to the external address signal for being preset and also responsive to an internal clock signal for applying carry. A Y address buffer 12 receives the two less significant bits of the external address signal and outputs the same at a predetermined timing. A Y decoder 13 decodes a two-bit column address signal applied by the Y address buffer 12. A shift register 14 shifts a four-bit output signal decoded by the Y decoder 13.

A timing generator 15 generates various kinds of clock signals, address switching signals MX, $\overline{MX}$ and the like at a predetermined timing.

Figure 2:
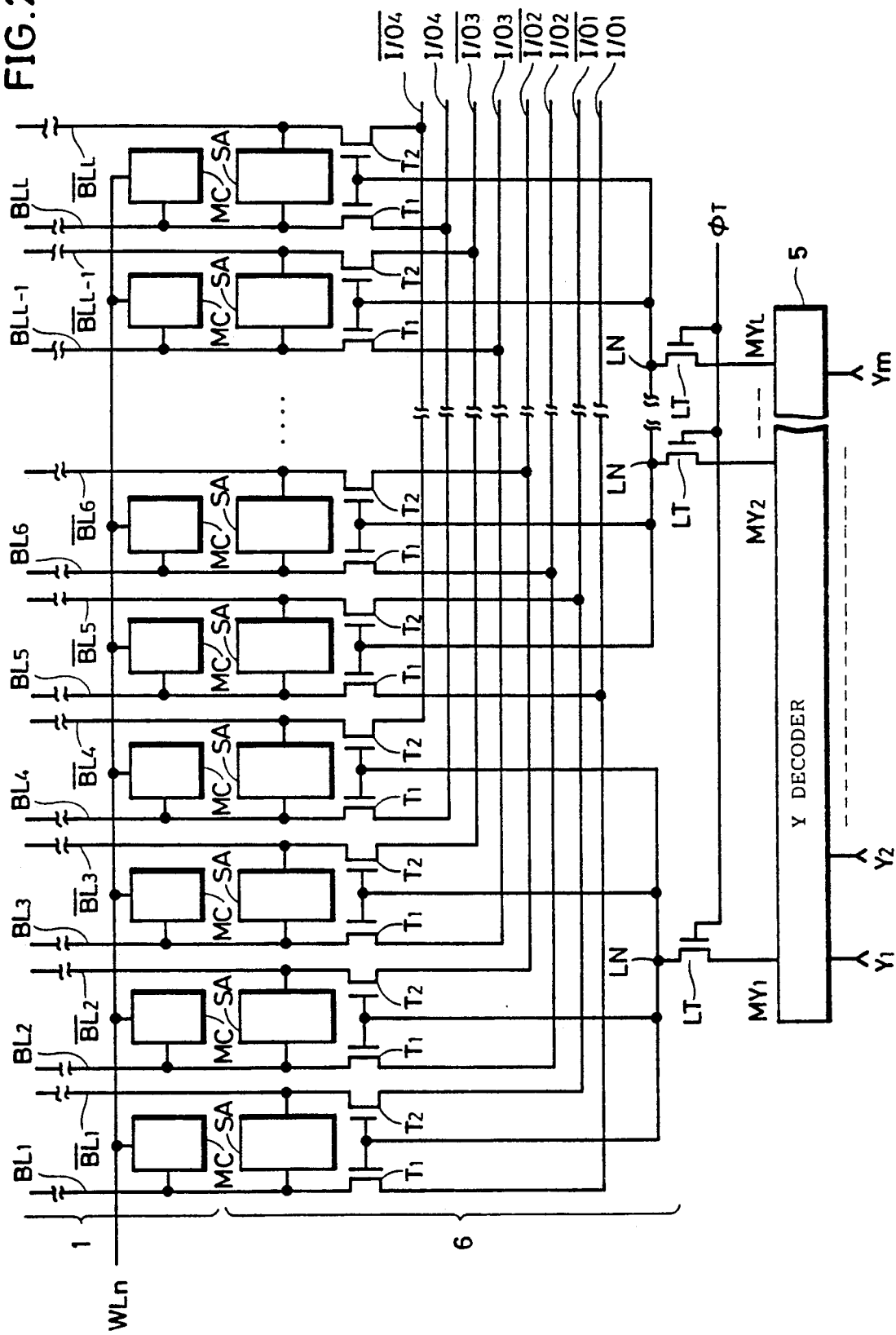
FIG. 2 is a circuit diagram showing a structure of a memory cell array, a (sense amplifier+I/O switch) block and a Y decoder as shown in FIG. 1.

FIG. 2 is circuit diagram showing a structure of the memory cell array 1, the block 6 and the Y decoder 5 as shown in FIG. 1.

The memory cell array 1 comprises a plurality of word lines and a plurality of bit lines $BL_1$, $\overline{BL_1}$, $BL_2$, $\overline{BL_2}$, ..., $BL_L$, $\overline{BL_L}$. In FIG. 2, however, only a single word line $WL_n$ is typically represented. The bit lines constitute folded bit lines and the respective two bit lines constitute one bit line pair. More specifically, bit lines $BL_1$, $\overline{BL_1}$ constitute one bit line pair up to bit lines $BL_2$, $\overline{BL_2}$ constitute another bit line pair and so forth, up to bit lines $BL_L$, $\overline{BL_L}$ constituting another bit line pair. Memory cells MC are connected to the intersections between the each of respective bit lines $BL_1$, $\overline{BL_1}$, ..., $BL_L$, $\overline{BL_L}$ and every second word line. Therefore, with respect to the respective bit line pairs, a single memory cell is connected to an intersection between one word line and either line of one bit line pair.

The bit line pairs $BL_1$, $\overline{BL_1}$ through $BL_L$, $\overline{BL_L}$ are each connected to a sense amplifier SA which senses potential difference between the bit lines and differentially amplifies the same. Further, the bit line pairs $BL_1$, $\overline{BL_1}$ through $BL_4$, $\overline{BL_4}$ are connected to data input/output line pairs $I/O_1$, $\overline{I/O_1}$ through $I/O_4$, $\overline{I/O_4}$, respectively, through transfer gates T1 and T2. Similarly, the bit line pairs $BL_5$, $\overline{BL_5}$ and $BL_6$, $\overline{BL_6}$ are connected to the data input/output line pairs $I/O_1$, $\overline{I/O_1}$ and $I/O_2$, $\overline{I/O_2}$, respectively, through the transfer gates T1 and T2, and the bit line pairs $BL_{L-1}$, $\overline{BL_{L-1}}$ and $BL_L$, $\overline{BL_L}$ are connected to the data input/output line pairs $I/O_3$, $\overline{I/O_3}$ and $I/O_4$, $\overline{I/O_4}$, respectively, through the transfer gates T1 and T2. The four pairs of the transfer gates T1 and T2 which are connected to the bit line pairs $BL_1$, $\overline{BL_1}$ through $BL_4$, $\overline{BL_4}$ receive an address decode signal $MY_1$ from the Y decoder 5 through a transistor LT. Similarly, the address decode signals $MY_2$ through $MY_L$ from the Y decoder 5 are applied to the corresponding four pairs of the transfer gates T1 and T2 through the corresponding transistor LT. This permits four bit line pairs to be selectively connected to the data input/output line pairs $I/O_1$, $\overline{I/O_1}$ through $I/O_4$, $\overline{I/O_4}$ in response to the address decode signals $MY_1$ through $MY_L$ from the Y decoder 5. The gate electrode of a latching transistor LT receives a clock signal $\phi_T$ for holding the address decode signal outputted from the Y decoder 5 for a certain period.

Figure 3:
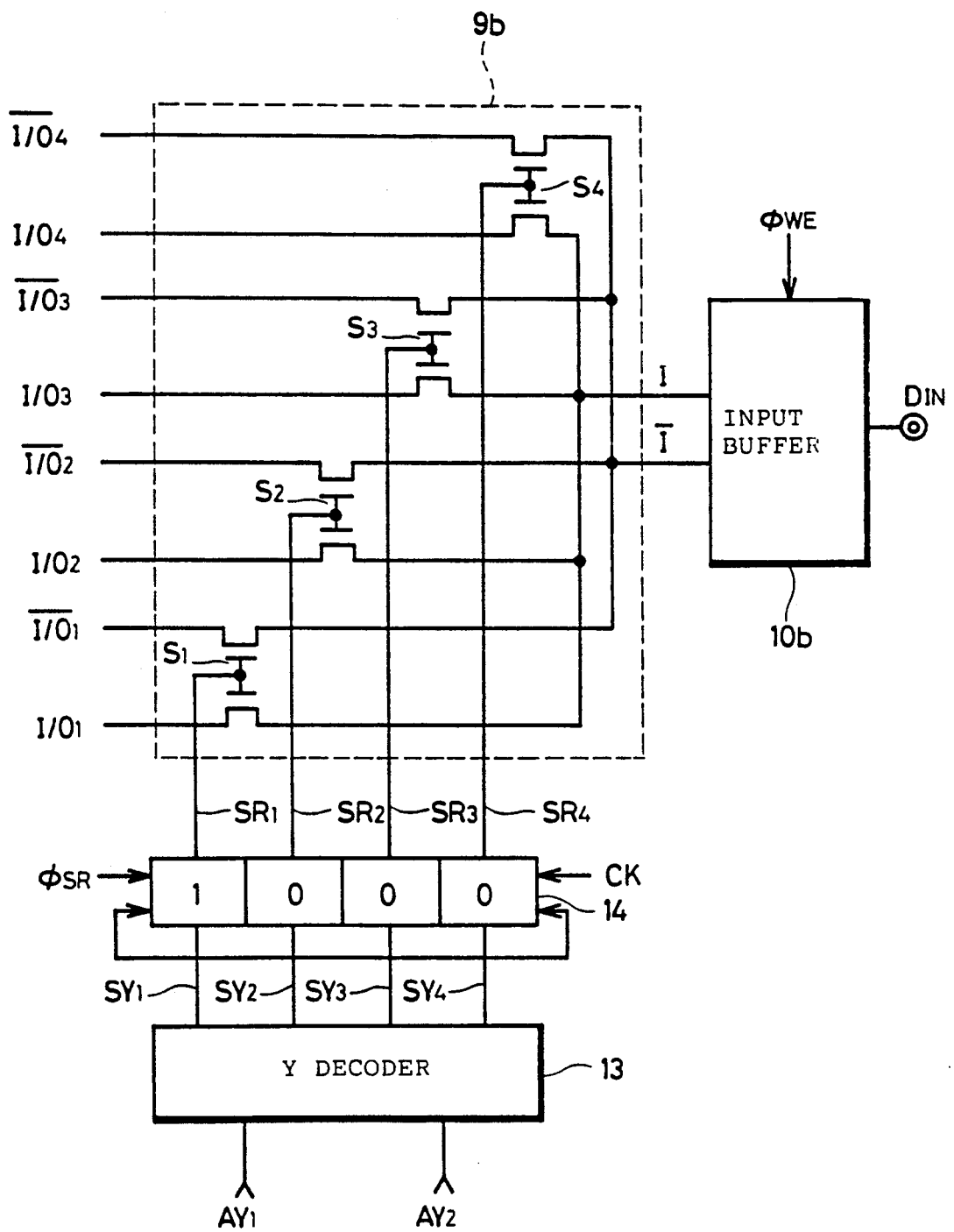
FIG. 3 is a circuit diagram showing a structure of a selector, an input buffer, a Y decoder and a shift register as shown in FIG. 1.

FIG. 3 is a circuit diagram showing a structure of the selector 9b, the input buffer 10b, the Y decoder 13 and the shift register 14 as shown in FIG. 1.

As shown in FIG. 3, the ends of the data input/output line pairs $I/O_1$, $\overline{I/O_1}$ through $I/O_4$, $\overline{I/O_4}$ are commonly connected to output terminals of the input buffer 10b through selector transistor pairs S1 through S4, respectively. Complementary output signals I and $\overline{I}$ are outputted from the output terminals of the input buffer 10b.

Meanwhile, the Y decoder 13 decodes the two less significant bits AY1 and AY2 of a column address signal and applies four bits of decode signals SY1 through SY4 to the respective bits of the shift register 14 as data. One of the four bits of the decode signals SY1 through SY4 becomes "1" and the remaining three bits become all "0".

The shift register 14 is responsive to a shift clock CK for shifting four bits of data in the right direction of the drawing and also responsive to a clock signal $\phi_{SR}$ for activating the corresponding output. This shift register 14 is a recirculating type so that when four clock pulses are applied, data return to the initial position. The four bits of the outputs SR1 through SR4 of the shift register 14 are each applied to the gate electrode of the corresponding one of the four selector transistor pairs S1 through S4. This permits one of the selector transistor pairs S1 through S4 which receives the output of "1" from the shift register 14 to be rendered conductive so that an output signal of the input buffer 10b is transmitted to one of the four data input/output line pairs. The input buffer 10b is responsive to a clock signal $\phi_{WE}$ for converting an input data $D_{IN}$ applied from the input terminal into complementary signals and also has driving ability enough to drive a data input/output line pair.

Figure 4:
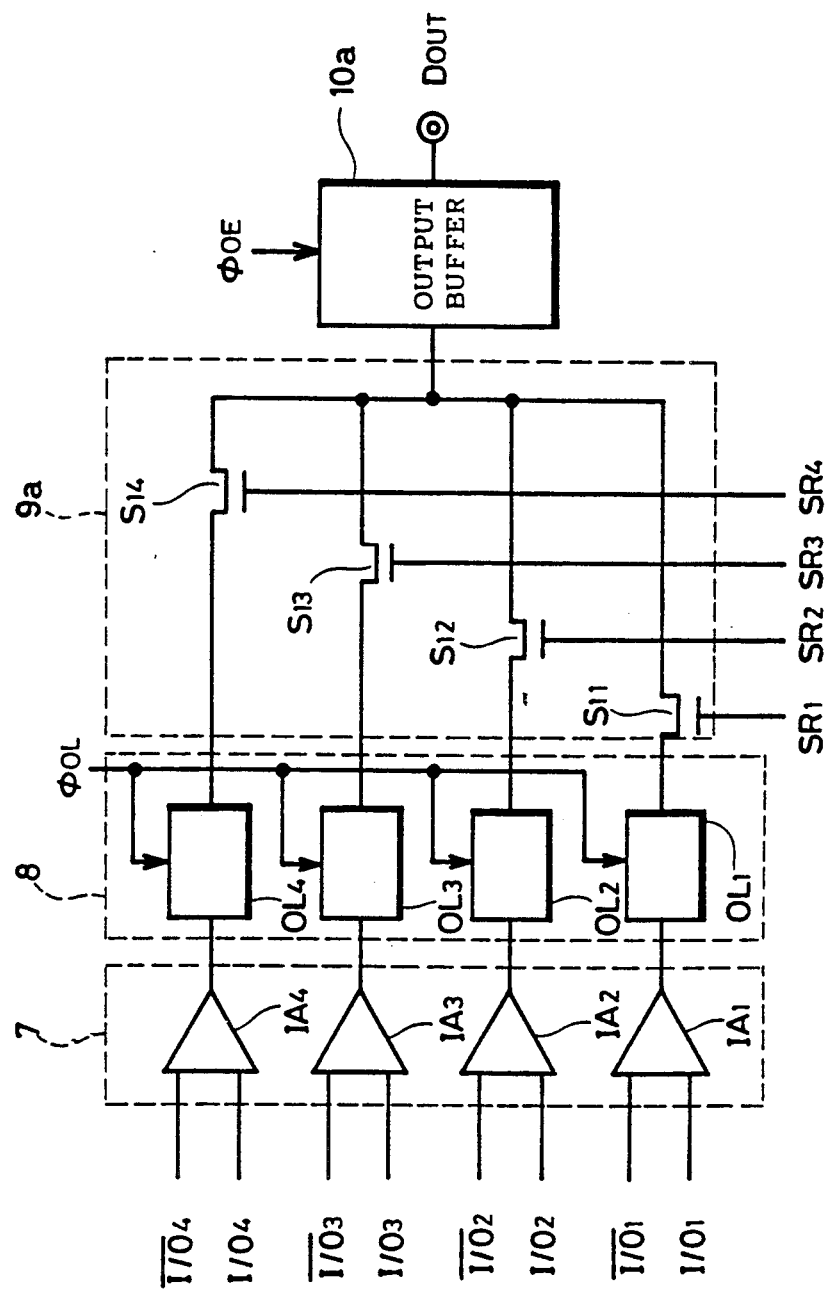
FIG. 4 is a circuit diagram showing a structure of an I/O amplifier, an output latch, a selector and an output buffer as shown in FIG. 1.

FIG. 4 is a circuit diagram showing a structure of the I/O amplifier 7, the output latch 8, the selector 9a and the output buffer 10a as shown in FIG. 1.

As shown in FIG. 4, the ends of the data input/output line pairs I/O$_1$, $\overline{I/O_1}$ through I/O$_4$, $\overline{I/O_4}$ are connected to I/O amplifiers IA1 through IA4, respectively, which sense potential differences between the data input/output line pairs and amplify them differentially. The output terminals of the I/O amplifiers IA1 through IA4 are connected to output latch circuits OL1 through OL4, respectively. The output latch circuits OL1 through OL4 are responsive to a clock signals $\phi_{OL}$ for latching output signals of the I/O amplifiers IA1 through IA4, respectively. The output terminals of the output latch circuits OL1 through OL4 are commonly connected to the input terminal of the output buffer 10a through selector transistors S11 to S14, respectively.

The gate electrodes of the selector transistors S11 through S14 receive the four bits of the outputs SR1 through SR4, respectively, from the shift register 14 as shown in FIG. 3. This permits one of the selector transistors S11 through S14 which receives the output of "1" from the shift register 14 to be rendered conductive so that data latched in one of the four output latch circuits OL1 through OL4 is transmitted to the output buffer 10a. The output buffer 10a is responsive to a clock signal $\phi_{OE}$ for transmitting the data applied from the output latch 8 through the selector 9a as an output data D$_{OUT}$ to the output terminal and also has driving ability enough to drive external circuits.

Figure 5:
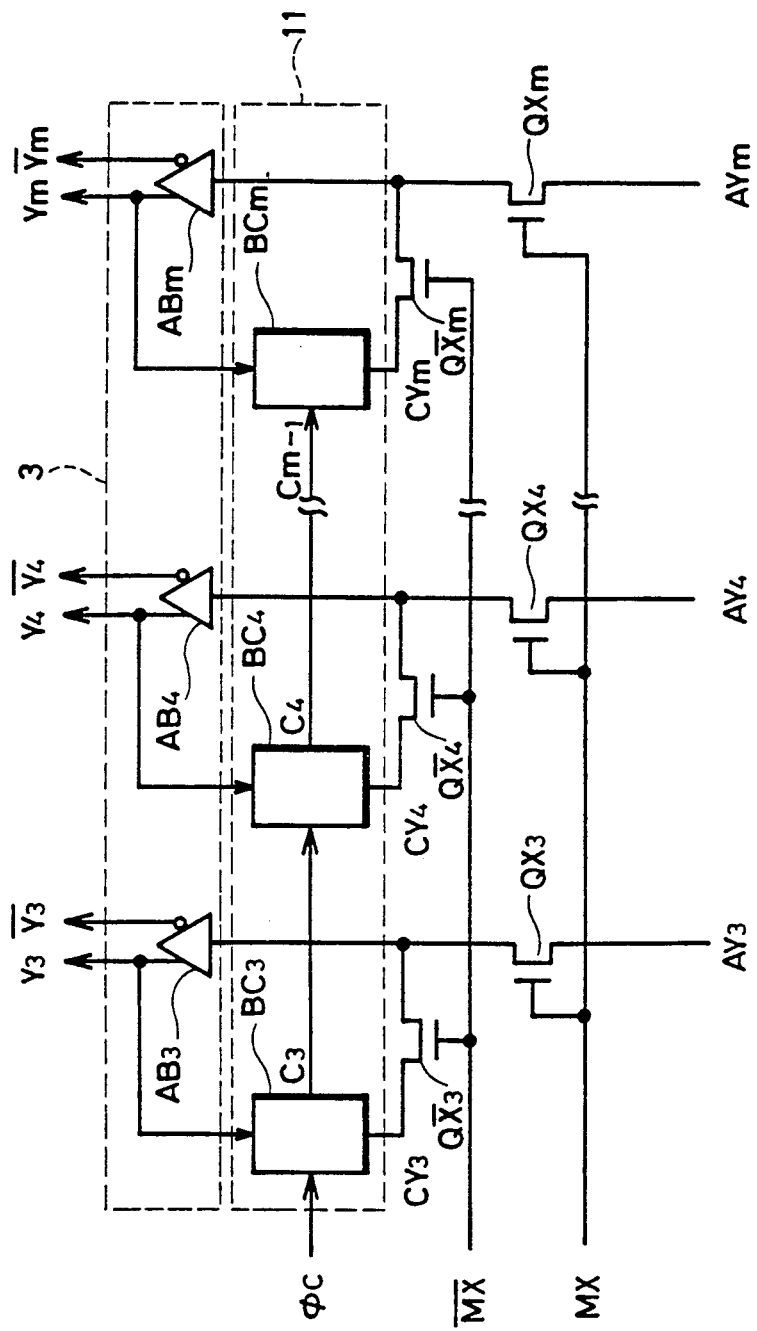
FIG. 5 is a circuit diagram showing a structure of a Y address buffer and a binary counter as shown in FIG. 1.

FIG. 5 is a circuit diagram showing a structure of the Y address buffer 3 and the binary counter 11 as shown in FIG. 1.

In FIG. 5, buffer circuits AB3 through ABm receive each an external column address signal excluding the two less significant bits and output complementary internal column address signals Y3, $\overline{Y3}$ through Y$_m$, $\overline{Y_m}$, respectively. Counter circuits BC3 through BC$_m$ are preset in response to the external column address signals AY$_3$ through AY$_m$, respectively. In addition, the counter circuit BC3 is carried in response to a clock signal $\phi_C$. The counter circuits BC4 through BCm are carried in response to carry signals C3 through Cm − 1, respectively. The counter circuits BC3 through BCm generate internal column address signals CY3 through CYm, respectively. Transistors QX3 through QXm and transistors Q$\overline{X}$3 through Q$\overline{X}$m are used to switch between the external column address signals AY3 through AYm and the internal column address signals CY3 through CYm, respectively, and controlled by complementary switching signals MX and $\overline{MX}$. When the switching signal MX is at the high level, the transistors QX3 through QXm are turned on so that the external column address signals AY3 through AYm are applied to the buffer circuits AB3 through ABm. When the switching signal $\overline{MX}$ is at the high level, the transistors Q$\overline{X}$3 through Q$\overline{X}$m are turned on so that the internal column address signals CY3 through CYm are applied to the buffer circuits AB3 through ABm.

Figure 6:
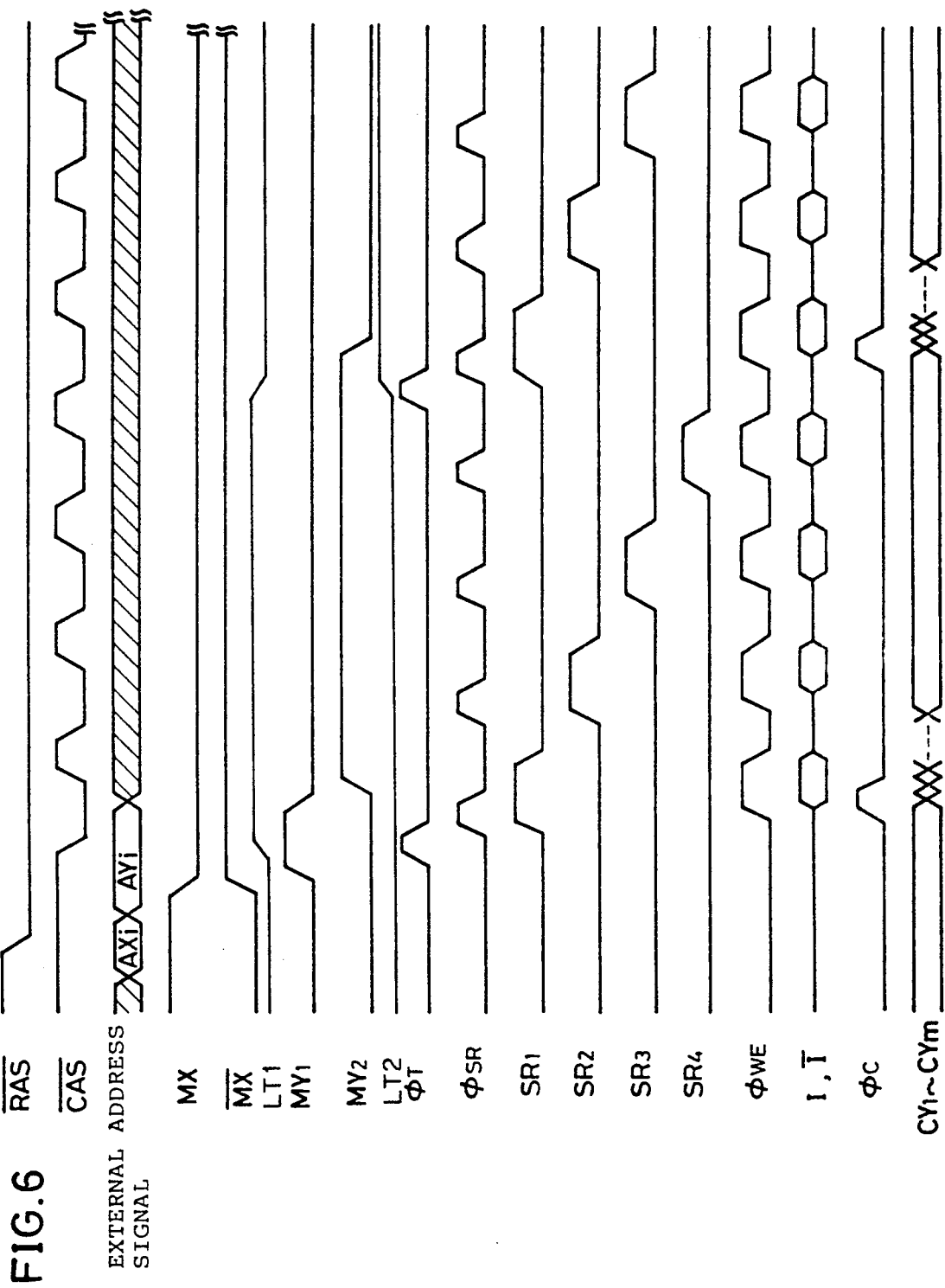
FIG. 6 is a timing chart for explaining the writing operation of the DRAM shown in FIGS. 1 through 5.

With reference to a timing chart in FIG. 6, a description will be now made on the writing operation of the DRAM shown in FIGS. 1 through 5.

When the externally applied row address strobe signal $\overline{RAS}$ transits from "1" (logically high level) to "0" (logically low level), the external address signal is accepted by the X address buffer 2 as a row address signal AXi and decoded by the X decoder 4. This permits the corresponding word line in the memory cell array 1 to be selected so that memory cells connected to that word line are selected.

Subsequently, when the external address signal changes into an external column address signal AYi, external column address signals AY1 and AY2 of the two less significant bits are decoded by the Y decoder 13. For example, when both two bits of the external column address signals AY1 and AY2 are "0", the leftmost bit of the shift register 14 becomes "1" and the remaining bits become "0", as shown in FIG. 3. Further, when the external column address signal AY1 is "1" and the other external column address signal AY2 is "0", the second bit from the leftmost of the shift register 14 becomes "1".

Meanwhile, column address signals Y3 through Ym of the third to m-th bits from the least significant bit outputted from the Y address buffer 3 are decoded by the Y decoder 5. For example, when all of the bits of the column address signals AY3 through AYm are "0", the address decode signal MY$_1$ shown in FIG. 2 is "1" and the remaining address decode signals MY$_2$ through MY$_L$ are all "0".

The clock signal $\phi_T$ changes then from "0" to "1". This permits the nodes LN shown in FIG. 2 to accept the address decode signals MY$_1$ through MY$_L$ outputted from the Y decoder 5 and immediately thereafter the clock signal $\phi_T$ changes from "1" to "0" so as to hold that state. The signal shown as LT1 in FIG. 6 represents the "1" transmitted from MY1 by means of the associated latch transistor LT. Charges applied to node LN during conduction of latch transistor LT are held in the parasitic capacitance of the node LN when nonconduction of the transistor LT causes isolation of the node from the MY1 input.

As a result, the bit line pairs BL$_1$, $\overline{BL_1}$ through BL$_4$, BL$_4$ are connected to the data input/output line pairs I/O$_1$, $\overline{I/O_1}$ through I/O$_4$, $\overline{I/O_4}$, respectively, through the transfer gates T1 and T2. Meanwhile, change of the external address signal from a row address signal to a column address signal is detected by an address transition detector (not shown).

Furthermore, after the external column address signals AY3 through AYm are accepted by the buffer circuit AB3 through ABm as shown in FIG. 5, the address switching signal MX becomes "0" and the address switching signal $\overline{MX}$ becomes "1". As a result, the transistor QX3 through QXm are put in a non-conductive state so that the external column address signals AY3 through AYm are electrically disconnected. On the other hand, the transistors Q$\overline{X}$3 through Q$\overline{X}$m are rendered conductive so that the internal column address signals CY3 through CYm from the binary counter 11 are supplied to the buffer circuits AB3 through ABm, respectively. The internal column address signals CY3 through CYm at this moment are equal to the external column address signals MY3 through MYm.

When the externally applied column address strobe signal $\overline{CAS}$ transits from "1" to "0", the clock signal $\phi_{SR}$ transits from "0" to "1" in response to the transition of the column address strobe signal $\overline{CAS}$. Then, only the output SR1 of the shift register 14 shown in FIG. 3 is activated to become "1", and the remaining outputs SR2 through SR4 become "0". As a result, only the selector transistor pair S1 is rendered conductive. Subsequently, when the clock signal $\phi_{WE}$ transits from "0" to "1", the input buffer 10b is activated so that the input data D$_{IN}$ is outputted from the output terminals as input data I and $\overline{I}$. The input data I and $\overline{I}$ are transmitted to the input/output line pair I/O$_1$ and $\overline{I/O_1}$ through the selector transistor pair S1, further transmitted to the bit line pair $BL_1$ and $\overline{BL_1}$ through the transfer gates T1 and T2 shown in FIG. 2, and written in a memory cell.

Furthermore, when the externally applied column address strobe signal $\overline{CAS}$ transits from "0" to "1", the contents of the shift register 14 is shifted to the right by one bit in response to the shift block CK.

Thereafter, the column address strobe signal $\overline{CAS}$ transits from "1" to "0" again so that only the output SR2 of the shift register 14 is activated to become "1". This permits only the selector transistor pair SR2 to be rendered conductive so that, in the same manner as described above, the input data is written in a memory cell through the selector transistor pair S2 and the transfer gates T1 and T2. Similarly, input data are written in the memory cells corresponding to the selector transistor pairs S3 and S4.

After the address decode signal $MY_1$ is accepted by the node LN as described above, the clock signal $\phi_C$ transits from "0" to "1". This permits the binary counter 11 shown in FIG. 5 to be carried so that the column address outputted from the Y address buffer 3 is increased by one. As a result, the address decode signal $MY_2$ outputted from the Y decoder 5 as shown in FIG. 2 becomes "1" and the remaining address decode signals become "0". This state is kept on standby until the preceding input data of four bits are all written in the corresponding memory cells. After the data are written through four cycles of the column address strobe signal $\overline{CAS}$ in the preceding four memory cells which have been selected by the address decode signal $MY_1$ from the Y decoder 5, the above mentioned address decode signal $MY_2$ in the stand-by state is latched yet by the node LN in response to the clock signal $\phi_T$. In FIG. 6 signal LT2 represents the "1" transmitted from MY2 to the second during application of the clock signal. During this time, the charge remaining at the first. This latch operation is performed during the "1" period (precharge period) of the column address strobe signal $\overline{CAS}$, and not during the "0" period in which writing is performed. Therefore, the writing speed can not be reduced.

After the subsequent address decode signal is latched by the node LN, four bits of the data are sequentially written in the memory cells MC at a high speed, as described above, through alternate change of the active state and inactive state of the column address strobe signal $\overline{CAS}$.

Figure 7:
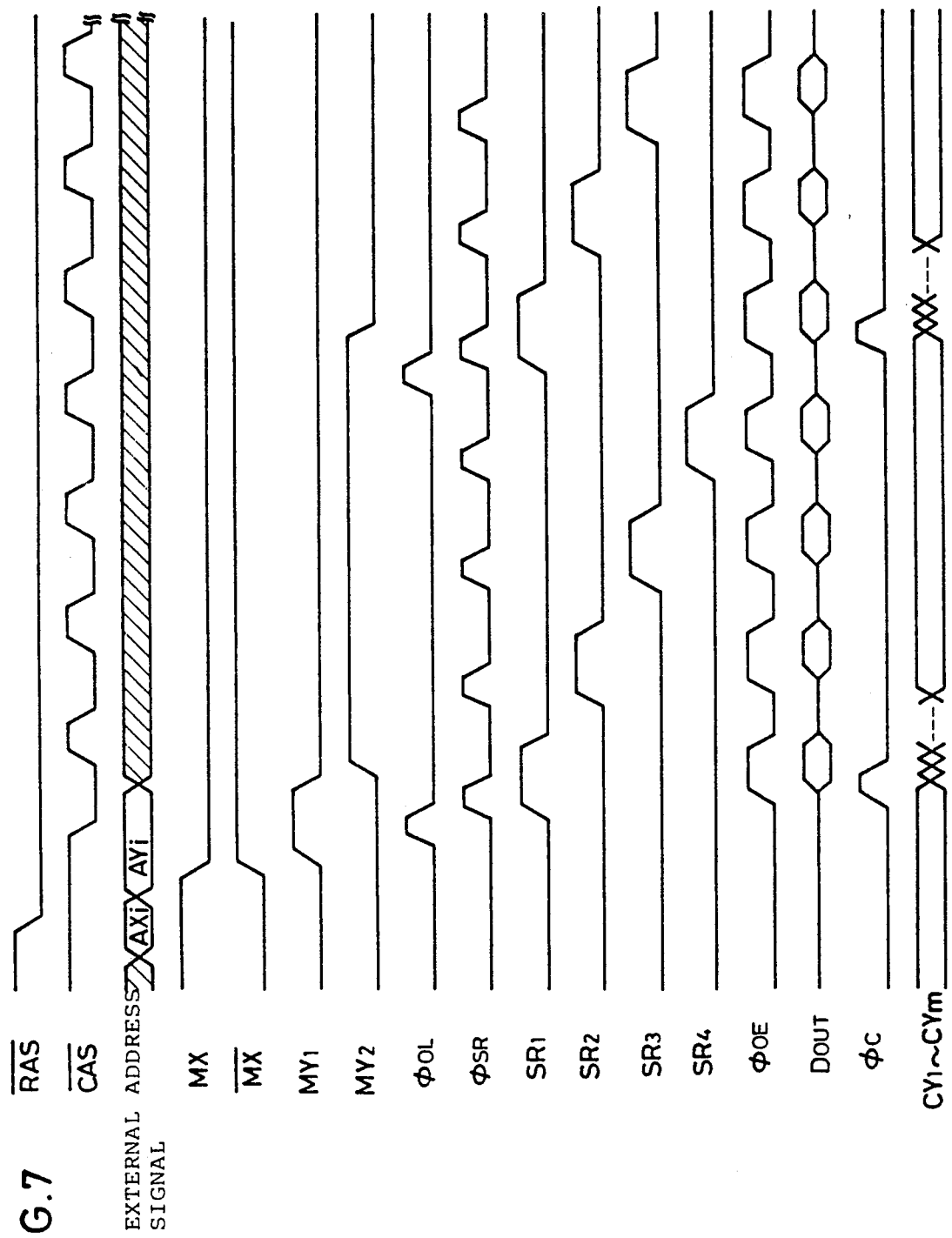
FIG. 7 is a timing chart for explaining the reading operation of the DRAM shown in FIGS. 1 through 5.

With reference to a timing chart of FIG. 7, the reading operation of the DRAM shown in FIGS. 1 through 5 will be described below.

When the externally applied row address strobe signal $\overline{RAS}$ transits from "1" to "0", as in the case of writing operation, one of the word lines in the memory cell array 1 is selected so that data in memory cells connected to the selected word line are each read out on the corresponding bit line.

Subsequently, when the external address signal changes in an external column address signal $AY_i$, as in the case of writing operation, for example, the leftmost bit of the shift register 14 as shown in FIG. 3 becomes "1" and the remaining bits become "0". Furthermore, as in the case of writing operation, assuming that the address decode signal $MY_1$ as shown in FIG. 2 becomes "1" and the remaining address decode signals $MY_2$ through $MY_L$ become "0", then the bit line pairs $BL_1$, $\overline{BL_1}$ through $BL_4$, $\overline{BL_4}$ will be connected to the data input/output line pairs $I/O_1$, $\overline{I/O_1}$ through $I/O_4$, $\overline{I/O_4}$, respectively, through the transfer gates T1 and T2. As a result, the data on the bit line pairs $BL_1$, $\overline{BL_1}$ through $BL_4$, $\overline{BL_4}$ which have been in advance amplified by the sense amplifier SA are read out to the data input/output line pairs $I/O_1$, $\overline{I/O_1}$ through $I/O_4$, $\overline{I/O_4}$, respectively.

Furthermore, after the external column address signals AY3 through AYm are accepted by the buffer circuits AB3 through ABm as shown in FIG. 5, as in the case of writing operation, the internal column address signals CY3 through CYm from the binary counter 11 are supplied to the buffer circuits AB3 through ABm, respectively. At this moment, the internal column address signals CY3 through CYm are equal to the external column address signals AY3 through AYm.

Meanwhile, the data read out on the data input/output line pairs $I/O_1$, $\overline{I/O_1}$ through $I/O_4$, $\overline{I/O_4}$ are further amplified by the I/O amplifier 7. The data amplified by the I/O amplifier 7 are responsive to transition of the clock signal $\phi_{OL}$ from "0" to "1" for being latched by the output latch 8. The contents of the output latch 8, if once latched in response to the clock signal $\phi_{OL}$, will not change unless the clock signal $\phi_{OL}$ transits again from "0" to "1". When the clock signal $\phi_{OL}$ becomes in an active state ("1" state), the externally applied column address strobe signal $\overline{CAS}$ transits from "1" to "0". In response to this transition of the column address strobe signal $\overline{CAS}$, the clock signal $\phi_{SR}$ transits from "0" to "1". This permits only the output SR1 of the shift register 14 as shown in FIG. 3 to be activated to become "1", and the remaining outputs SR2 through SR4 become "0". As a result, only the selector transistor S11 is rendered conductive so that the data latched by the output latch circuit OL1 is transmitted to the output buffer 10a. Subsequently, when the clock signal $\phi_{OE}$ transits from "0" to "1", the output buffer 10a is activated so that the data is read out at the output terminal as an output data $D_{OUT}$.

Furthermore, when the externally applied column address strobe signal $\overline{CAS}$ transits from "0" to "1", the contents of the shift register 14 is shifted to the right by one bit in response to the shift clock CK.

Thereafter, when the column address strobe signal $\overline{CAS}$ transits again from "1" to "0", only the output SR2 of the shift register 14 is activated to become "1". This permits only the selector transistor S12 to be rendered conductive so that the data in the output latch circuit OL2 is read out at the output as an output data $D_{OUT}$ through the selector transistor S12 and the output buffer 10a, as described above. Similarly, the data in the output latch circuits OL3 and OL4 are read out sequentially at the output terminal as the output data $D_{OUT}$ through the repeated cycles of the column address strobe signal $\overline{CAS}$. In this case, the time required for reading is reduced because it means the time taken to transmit data from the output latch 8 to the output terminal.

While four bits of data are sequentially read out of the output latch 8 as described above, the subsequent four bits of data are read out of the memory cell array 1. More specifically, after data on the data input/output line pairs $I/O_1$, $\overline{I/O_1}$ through $I/O_4$, $\overline{I/O_4}$ are latched by the output latch 8 in response to the clock signal $\phi_{OL}$, the clock signal $\phi_C$ transits from "0" to "1". This causes the binary counter 11 as shown in FIG. 5 to be carried so that the column address outputted from the Y address buffer 3 is increased by one. As a result, the address decode signal $MY_2$ outputted from the Y decoder 5 as shown in FIG. 2 becomes "1" and the remaining address decode signals become "0". This permits the data read out on the four corresponding bit line pairs to be read out on the data input/output line pairs I/O$_1$, $\overline{I/O_1}$ through I/O$_4$, $\overline{I/O_4}$, respectively and further amplified by the I/O amplifier 7. These data are held by the I/O amplifier 7, however, until the preceding four bits of data latched by the output latch 8 are all read out at the output terminal. After the preceding four bits of data selected by the address decode signal MY$_1$ from the Y decoder 5 are read out through four cycles of the column address strobe signal $\overline{CAS}$, the subsequent four bits of data held by the I/O amplifier 7 are latched by the output latch 8 in response to the clock signal $\phi_{OL}$. This latch operation is performed during the "1" period (precharge period) of the column address strobe signal $\overline{CAS}$, and not during the "0" period in which reading is performed. Therefore, the reading speed can not be reduced.

After the subsequent four bits of data are latched by the output latch 8, the four bits of data are sequentially read out at the output terminal as output data D$_{OUT}$ at a high speed, as described above, through alternate repetition of the active state and inactive state of the column address strobe signal $\overline{CAS}$.

Figure 8:
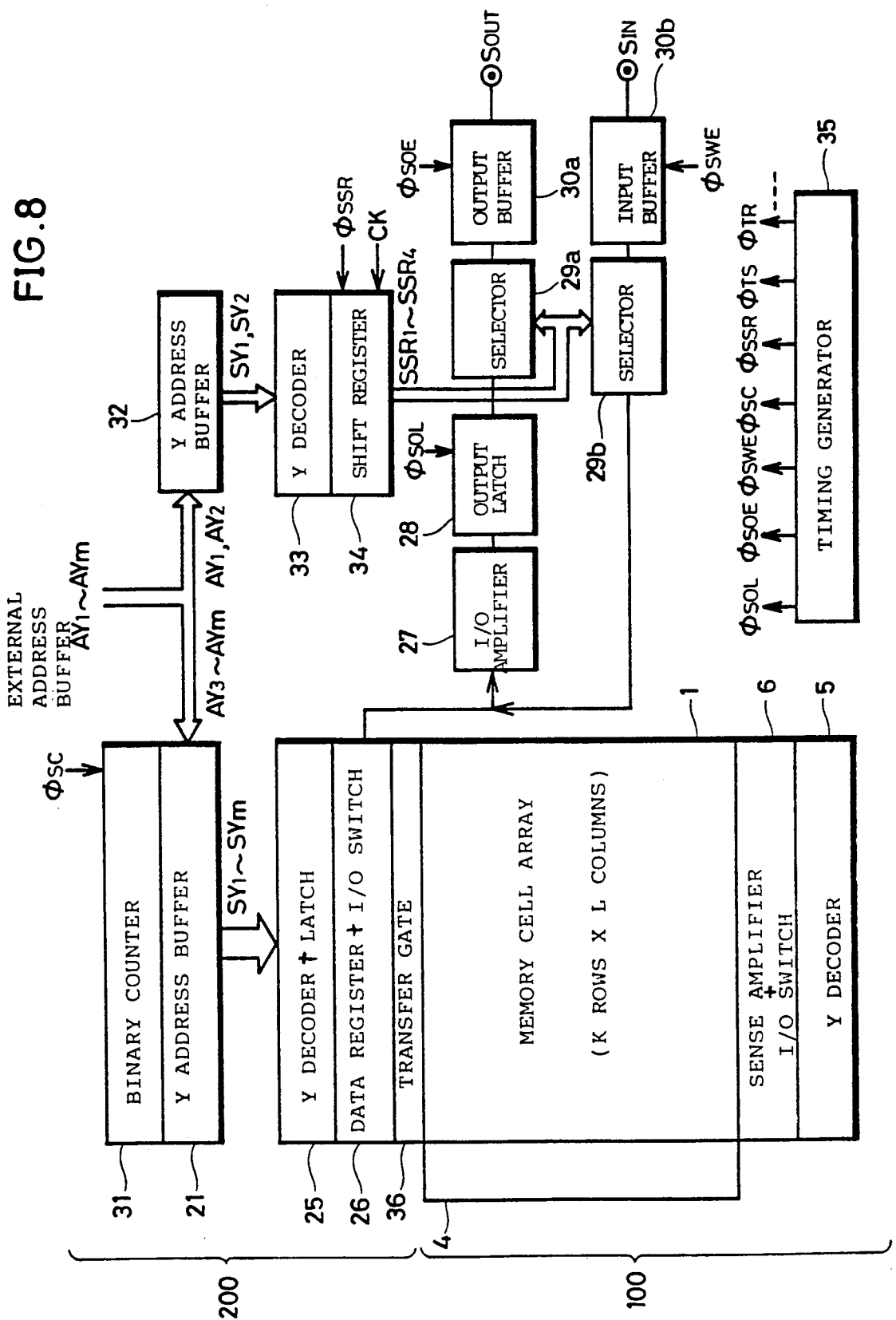
FIG. 8 is a block diagram showing a structure of a video RAM according to another embodiment of the present invention.

FIG. 8 is a block diagram showing a schematical structure of the main part of a video RAM according to another embodiment of the present invention.

The video RAM is a memory used to store picture data and comprises a random accessible RAM portion (random access memory portion) 100 and a serially accessible SAM portion (serial access memory portion) 200.

The RAM portion 100 is configured in the same manner as in FIG. 1. It is to be noted, however, that only the parts corresponding to the memory cell array 1, the X decoder 4, the Y decoder 5 and the block 6 in FIG. 1 are shown in FIG. 8 and not the remaining parts.

The SMA portion 200 comprises a (data register-+I/O switch) block 26 (referred to simply as block 26 hereinafter) and a (Y decoder+latch) block 25 (referred to simply as block 25 hereinafter). A transfer gate 36 is provided between the RAM portion 100 and the SMA portion 200.

In this video RAM, data of one row randomly accessed in the RAM portion 100 are transferred to the SAM portion 200, and the transferred data are serially read out of the SAM portion 200 at a high speed. Conversely, data of one row serially written in the SAM portion 200 at a high speed are transferred to the RAM portion 100. Furthermore, while data are read out of the SAM portion 200, another data can be written in the RAM portion 100 independent of operation of the SAM portion 200. Conversely, while data is read out of the SAM portion 100, another data can be written in the SAM portion 200 independent of operation of the RAM portion 100.

Figure 9:
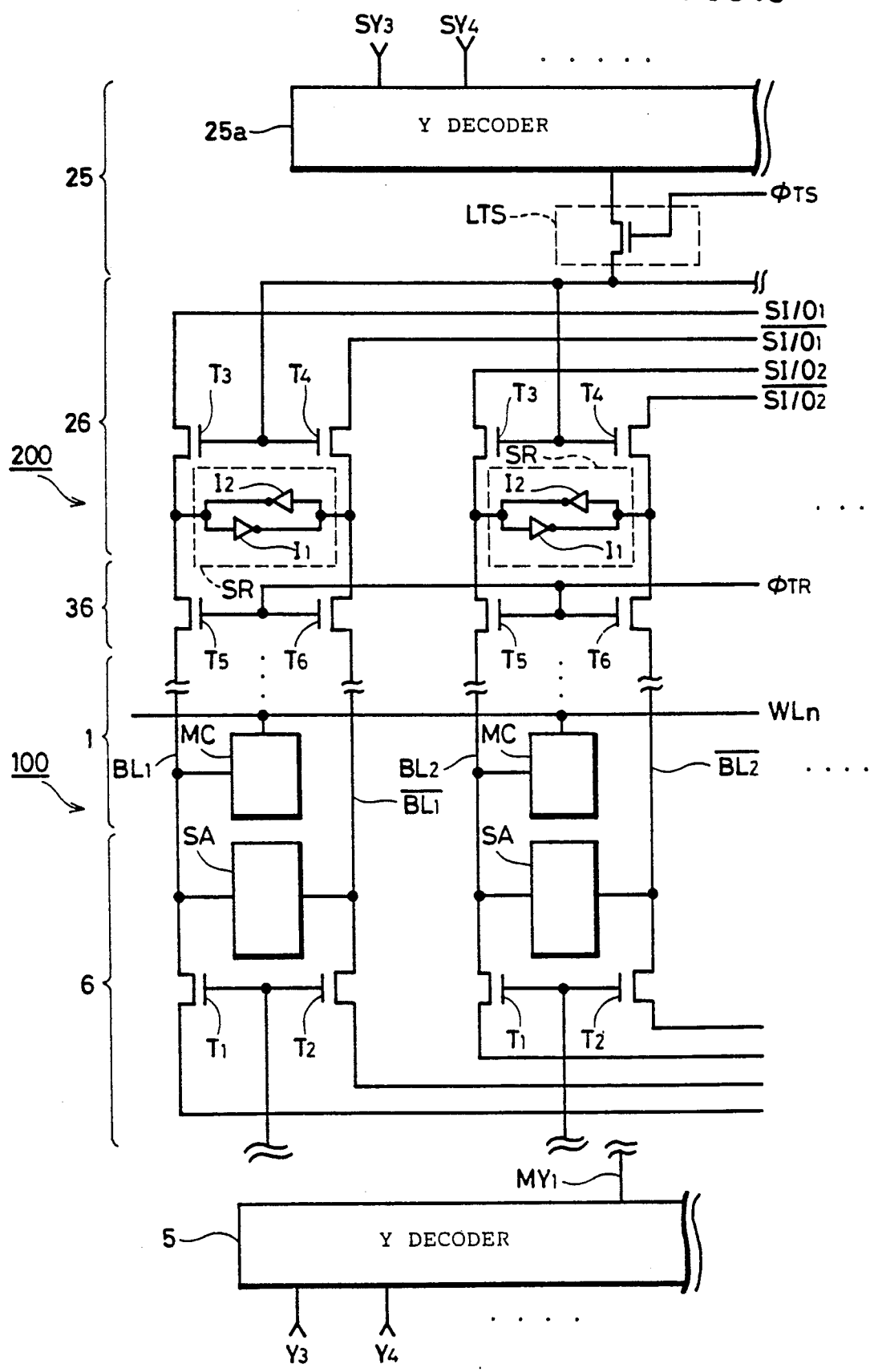
FIG. 9 is a circuit diagram showing the main part of the structure of the video RAM in FIG. 8.
Figure 10:
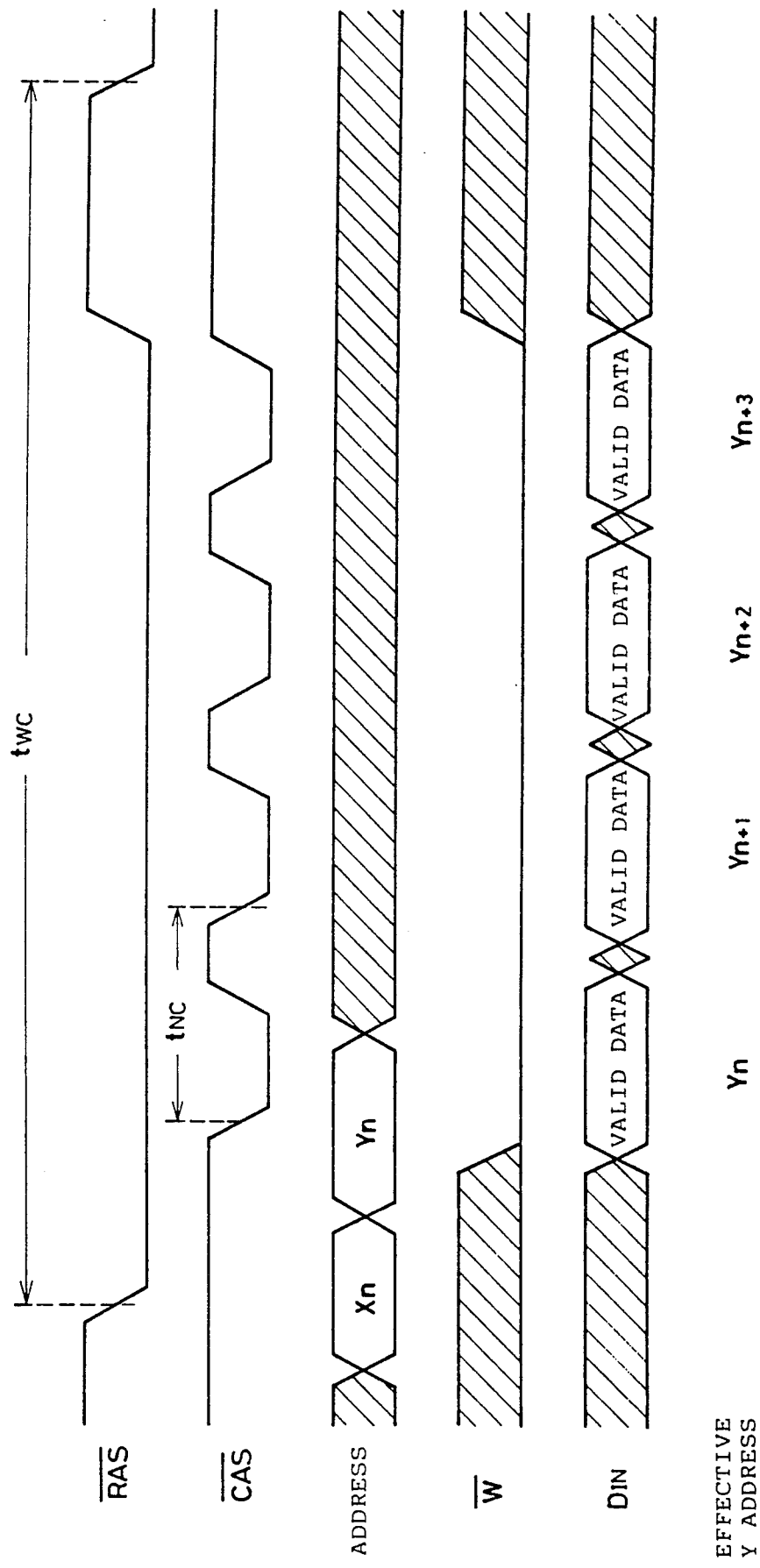
FIG. 10 is a timing chart for explaining writing operation of a conventional DRAM in the nibble mode.
Figure 11:
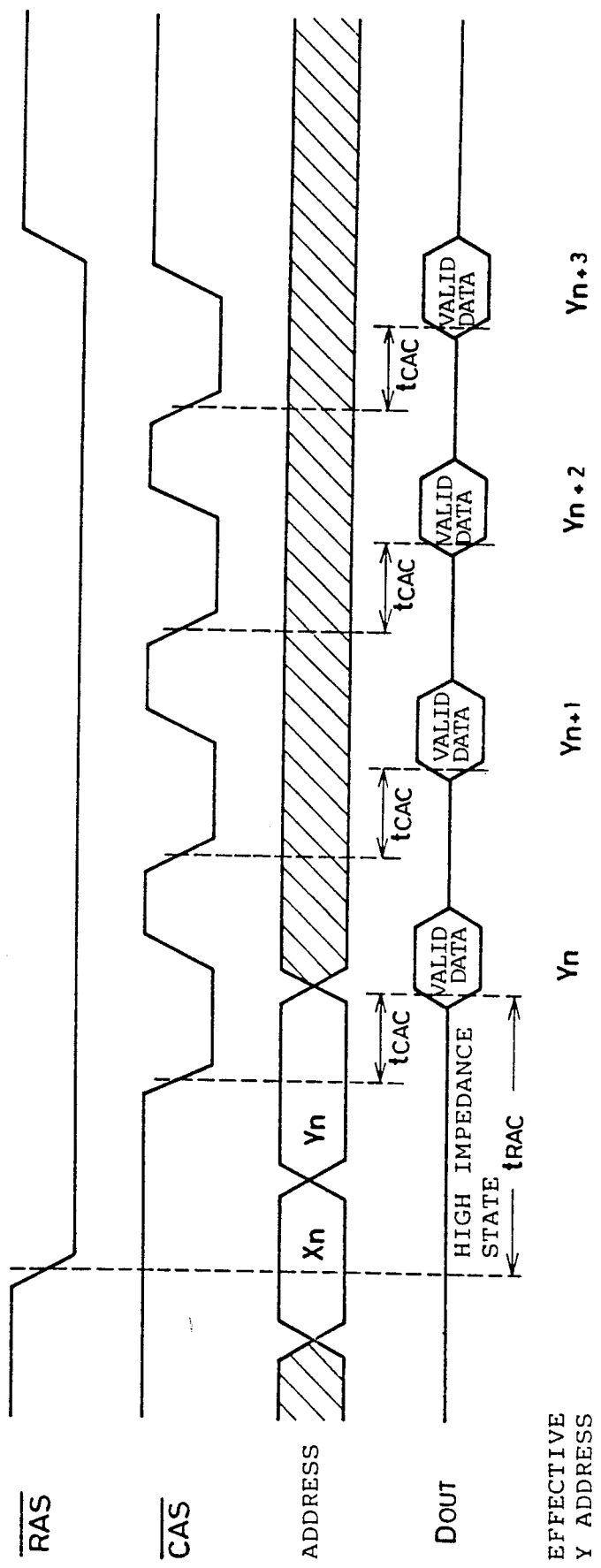
FIG. 11 is a timing chart for explaining reading operation of a conventional DRAM in the nibble mode.

In FIG. 9, a specific circuit structure of the main part of the video RAM in FIG. 8 is shown. The block 26 in the SAM portion 200 comprises a plurality of register circuits SR. Each register circuit comprises two inverters 11 and 12. The register circuits SR are connected to input/output line pairs SI/O$_1$, $\overline{SI/O_1}$ and SI/O$_2$, $\overline{SI/O_2}$, respectively, through selecting transistors T3 and T4. The block 25 of the SAM portion 200 comprises a Y decoder 25a and a plurality of latch transistors LTS. Outputs of the Y decoder 25a are applied to the gate electrodes of the selecting transistors T3 and T4 through the latch transistors LTS. The transfer gate 36 comprises a plurality of transfer transistors T5 and T6.

Each register circuit SR is connected to the corresponding bit lines pair through the transfer transistors T5 and T6.

A clock signal $\phi_{TR}$ is applied to the gate electrodes of the transfer transistors T5 and T6. When data are to be transferred between the RAM portion 100 and the SAM portion 200, the transfer transistors T5 and T6 are rendered conductive in response to the clock signal $\phi_{TR}$. Furthermore, when the RAM portion 100 and the SAM portion 200 are to operate independently of each other, the transfer transistors T5 and T6 are rendered non-conductive in response to the clock signal $\phi_{TR}$.

For the SAM portion 200 shown in FIGS. 8 and 9, it is also required that writing and reading of data are performed at a higher speed. For this purpose, a Y address buffer 21, a binary counter 31, a Y address buffer 32, a Y decoder 33, a shift register 34, an I/O amplifier 27, an output latch 28, a selector 29a, a selector 29b, an output buffer 30a, an input buffer 30b and a timing generator 35 are provided, as shown in FIG. 8.

The basic structures of these circuits are the same as shown in FIGS. 3 through 5.

The operation of the SAM portion 200 shown in FIGS. 8 and 9 is also basically the same as that of the RAM portion 100.

For example, when data from the SAM portion 200 should be written in memory cells MC connected to a given word line WL$_n$ in the RAM portion 100, the clock signal $\phi_{TR}$ becomes initially "0" so that the transfer transistors T5 and T6 are rendered non-conductive. This results in electrical disconnection between the SAM portion 200 and the RAM portion 100.

Subsequentially, as in the operation of the above described DRAM, an input data S$_{IN}$ is accepted by the input buffer 30b in response to the clock signal $\phi_{SWE}$. In response to this, address setting is performed in order to determine the first address in response to external address signals AY1 through AYm equal to the external address signals applied to the RAM portion 100.

Thereafter, in response to the serial clock CK, a similar operation as in the RAM portion 100 is performed so that data are written in the register circuits SR sequentially. In the RAM portion 100, a given row is in advance selected during the above mentioned writing operation. The transfer transistors T5 and T6 are then rendered conductive so that the data are transferred from the SAM portion 200 to the RAM portion 100.

In reading data, contrary to the above, data are transferred from the RAM portion 100 to the SAM portion 200. Thereafter, the data of one row which have been held in the SAM portion 200 are sequentially outputted to the external.

As described in the foregoing, the present invention is applicable to both the RAM portion and the SAM portion of a semiconductor memory device comprising a RAM portion and a SAM portion.

Though in the above description the outputs SR1 through SR4 of the shift register 14 take by turns the value of "1" beginning with the SR1, this is intended only as one example, and therefore, there can be other cases where any one of SR2, SR3 and SR4 becomes "1" at first in response to the preset external column address signal. For example, when the output SR3 first becomes "1", selection is performed in a recirculating manner in the order of SR3, SR4, SR1, SR2, SR3 and so forth through the alternate change of the column address strobe signal $\overline{CAS}$ In the selection by the Y decoder 5 also, for example, when the address decode signal $MY_n$ is selected at first, selection is performed in a recirculating manner in the order of $Y_n, Y_{n+1}, \ldots, Y_{n-1}, Y_n$.

Additionally, though the shift register 14 comprises four bits in the above described embodiment, it can comprise eight bits depending on the space left in the device.

According to the present invention, while the selecting signal generated by the second selecting device is held, the subsequent selecting operation is performed by the first selecting device so that no specific time is required for the selecting operation, and thus information of one row can be written in at a higher speed.

Furthermore, according to the present invention, while information read out of the memory cell array and then held by the holding device is sequentially selected, the subsequent information to be read out of the memory cell array is selected in advance so that no specific time is required for the selecting operation and thus information of one row can be read out at a higher speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   memory cell array comprising a plurality of memory cells arranged in rows and columns;
   internal address generating means responsive to an externally applied address signal for generating an internal column address signal;
   first selecting means responsive to said internal column address signal generated by said internal address generating means for generating a selecting signal which simultaneously selects a plurality of columns in said memory cell array;
   holding means for holding said selecting signal generated by said first selecting means;
   second selecting means for sequentially selecting said plurality of column simultaneously selected by said selecting signal held by said holding means;
   writing means for applying external information to the column selected by said second selecting means; and
   timing control means for performing timing control in such a manner that during the selecting operation by said second selecting means, the selecting operation by said first selecting means is performed in response to the subsequent internal column address signal.

2. The semiconductor memory device according to claim 1, wherein
   said internal address generating means is responsive to an externally applied column address signal for initially generating an internal column address signal equal to said column address signal, and thereafter sequentially generating internal column address signals following said internal column address signal.

3. The semiconductor memory device according to claim 1, wherein
   said internal address generating means comprises:
   binary counter means for receiving a part of said externally applied address signal and sequentially counting up the same; and
   address buffer means for initially outputting said part of said externally applied address signal as an internal column address signal, and thereafter sequentially outputting outputs of said binary counting means as internal column address signals.

4. The semiconductor memory device according to claim 3, wherein
   said second selecting means comprises:
   a decoder decoding the remaining part of said externally applied column address signal and outputting the decoded signal;
   a shift register holding said decoded signal from said decoder and sequentially shifting the same; and
   a selector responsive to said decoded signal held by said shift register for connecting said writing means to any one of said plurality of columns simultaneously selected by said selecting signal.

5. The semiconductor memory device according to claim 4, wherein
   said first selecting means comprises a column decoder decoding said internal column address signal.

6. The semiconductor memory device according to claim 5, wherein
   said holding means comprise a plurality of latch circuits connected between outputs of said address buffer means and said plurality of columns.

7. The semiconductor memory device according to claim 6, wherein
   said writing means comprises an input terminal receiving externally applied information and an input buffer.

8. The semiconductor memory device according to claim 1, which further comprises:
   third selecting means responsive to an externally applied address signal for selecting one row in said memory cell array.

9. The semiconductor memory device according to claim 1, which further comprises:
   second holding means for holding a plurality of pieces of information read out of a plurality of columns selected by said first selecting means; and
   third selecting means for sequentially selecting said plurality of pieces of information held by said second holding means; and wherein
   said timing control means performs timing control in such a manner that during information selecting operation by said third selecting means, selecting operation is performed by said first selecting means in response to the subsequent internal column address signal.

10. A semiconductor memory device comprising:
    memory cell array comprising a plurality of memory cells arranged in rows and columns;
    internal address generating means responsive to an externally applied address signal for generating an internal column address signal;
    first selecting means responsive to said internal column address signal generated from said internal address generating means for simultaneously selecting a plurality of columns in said memory cell array;
    holding means for holding a plurality of pieces of information read out of the plurality of columns selected by said first selecting means;

second selecting means for sequentially selecting said plurality of pieces of information held by said holding means; and timing control means for performing timing control in such a manner that during information selecting operation by said second selecting means, selecting operation is performed by said first selecting means in response to the subsequent internal column address signal.

11. The semiconductor memory device according to claim 10, wherein said internal address generating means is responsive to an externally applied column address signal for initially generating an internal column address signal equal to said column address signal, and thereafter, sequentially generating internal column address signals following said internal column address signal.

12. The semiconductor memory device according to claim 10, wherein said internal address generating means comprises:

binary counter means for receiving a part of said externally applied address signal and sequentially counting up the same; and address buffer means for initially outputting said part of said externally applied address signal as an internal column address signal, and thereafter, sequentially outputting outputs of said binary counting means as internal column address signals.

13. The semiconductor memory device according to claim 12, wherein said second selecting means comprises:

a decoder decoding the remaining part of said externally applied address signal and outputting the decoded signal;

a shift register holding said decoded signal from said decoder and sequentially shifting the same; and a selector responsive to said decoded signal held by said shift register for outputting any one of said plurality of pieces of information held by said holding means.

14. The semiconductor memory device according to claim 10, which further comprises:

third selecting means responsive to an externally applied address signal for selecting one row in said memory cell array.

15. A semiconductor memory device comprising:

memory cell array comprising a plurality of memory cells arranged in rows and columns;

a plurality of information holding means each provided to correspond to each of said plurality of columns in said memory cell array for holding information;

information transfer means for transferring information between said plurality of information holding means and said memory cell array;

internal address generating means responsive to an externally applied column address signal for generating an internal column address signal;

first selecting means responsive to said internal column address signal generated from said internal address generating means for generating a selecting signal which simultaneously selects any plurality of said plurality of information holding means;

first holding means for holding said selecting signal generated by said first selecting means;

second selecting means for sequentially selecting said plurality of columns simultaneously selected by said selecting signal held by said first holding means;

writing means for applying information from the external to a column selected by said second selecting means; and timing control means for performing timing control in such a manner that during selecting operation by said second selecting means, selecting operation is performed by said first selecting means in response to the subsequent internal column address signal.

16. The semiconductor memory device according to claim 15, which further comprises:

second holding means for holding a plurality of pieces of information read out of a plurality of information holding means selected by said first selecting means; and third selecting means for sequentially selecting said plurality of pieces of information held by said second holding means; and wherein said timing control means performs timing control in such a manner that during information selecting operation by said third selecting means, selecting operation is performed by said first selecting means in response to the subsequent internal column address signal.

17. An operating method of a semiconductor memory device which comprises a memory cell array comprising a plurality of memory cells arranged in rows and columns, comprising the steps of:

generating an internal column address signal in response to an externally applied address signal;

generating a selecting signal for simultaneously selecting a plurality of columns in said memory cell array in response to said internal column address signal;

holding said selecting signal;

sequentially selecting said plurality of columns simultaneously selected by said held selecting signal;

applying information from the external to said selected column; and performing timing control in such a manner that during said sequential selecting operation, selecting operation is performed with respect to a plurality of columns in response to the subsequent internal column address signal.

18. An operating method of a semiconductor memory device which comprises a memory cell array comprising a plurality of memory cells arranged in rows and columns, comprising the steps of:

generating an internal column address signal in response to an externally applied address signal, simultaneously selecting a plurality of columns in said memory cell array in response to said internal column address signal, holding a plurality of pieces of information read out of said selected plurality of columns;

sequentially selecting said held plurality of pieces of information; and performing timing control in such a manner that during said sequential information selecting operation, selecting operation is performed with respect to a plurality of columns in response to the subsequent internal column address signal.

* * * * *